(12) United States Patent
Aoki et al.

(10) Patent No.: US 7,250,311 B2
(45) Date of Patent: Jul. 31, 2007

(54) WIREBOND CRACK SENSOR FOR LOW-K DIE

(75) Inventors: Toyohiro Aoki, Yasu (JP); Lloyd G. Burrell, Poughkeepsie, NY (US); Wolfgang Sauter, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 170 days.

(21) Appl. No.: 10/906,507

(22) Filed: Feb. 23, 2005

(65) Prior Publication Data
US 2006/0189007 A1    Aug. 24, 2006

(51) Int. Cl.
*H01L 21/66* (2006.01)
*H01L 23/48* (2006.01)

(52) U.S. Cl. .................. 438/14; 438/614; 257/781; 257/784

(58) Field of Classification Search ........... 438/14, 438/17, 18, 612, 613, 614, 617; 257/737, 257/738, 779, 780, 781, 784–786
See application file for complete search history.

(56) References Cited

U.S. PATENT DOCUMENTS

| | | | |
|---|---|---|---|
| 5,751,065 A | 5/1998 | Chittipeddi et al. | |
| 5,918,107 A | 6/1999 | Fogal et al. | |
| 5,963,046 A | 10/1999 | Konuk | |
| 6,117,693 A | 9/2000 | Fogal et al. | |
| 6,366,209 B2 | 4/2002 | Dishongh et al. | |
| 6,395,568 B1 | 5/2002 | Blish et al. | |
| 6,503,820 B1 | 1/2003 | Shu | |
| 6,548,881 B1 | 4/2003 | Blish et al. | |
| 6,650,010 B2 | 11/2003 | Davis et al. | |
| 6,682,981 B2 | 1/2004 | Leedy | |
| 6,737,745 B2 * | 5/2004 | Sabin et al. | ............... 257/758 |
| 6,756,908 B2 | 6/2004 | Gass et al. | |
| 6,759,860 B1 | 7/2004 | Hsiung et al. | |
| 2001/0043143 A1 | 11/2001 | Dishongh et al. | |
| 2003/0197280 A1 | 10/2003 | Davis et al. | |
| 2004/0099877 A1 | 5/2004 | Towle et al. | |
| 2004/0119168 A1 | 6/2004 | Downey et al. | |
| 2004/0129938 A1 | 7/2004 | Landers et al. | |

FOREIGN PATENT DOCUMENTS

EP    0 895 073 B1    7/1998

* cited by examiner

*Primary Examiner*—Kevin M. Picardat
(74) *Attorney, Agent, or Firm*—Scully, Scott, Murphy & Presser, P.C.; William D. Sabo, Esq.

(57) ABSTRACT

A sensor for measuring cracks in a semiconductor device, such as a wafer and, more particularly, to a BEOL wirebond crack sensor for low-k dies or wafers, and a method of providing the wirebond crack sensor for low-k wafers or the like structures.

14 Claims, 6 Drawing Sheets

WIREBOND CRACK SENSOR FOR LOW-K DIE

BACKGROUND OF THE INVENTION

1. Field of the Invention

The present invention relates to a sensor for measuring cracks in a semiconductor device, such as a wafer and, more particularly, pertains to a wirebond crack sensor for low-k dies or wafers, and to a method of providing the wirebond crack sensor for low-k wafers or the like structures.

During the production of diverse types of electronic devices, and especially semiconductor chips and pads which are sliced from wafers, wherein, in conjunction with the manufacture of SUPs (structures under pads), which facilitate that essentially all wiring and active devices may be arranged so as to be fully located underneath wirebond pads, there are employed low-k BEOL (Back-End-Of-Line) dielectric materials in a wiring level integration, which are essentially substantially softer and weaker in their nature and physical makeup than are conventional oxide BEOL films. During the process of wirebonding for instance, as ball grid arrays (BGAs), which may comprise gold balls, are applied to the wirebond pad through a welding procedure, as widely employed in the semiconductor fabrication technology, there may be employed a force of approximately 10 to 14 grams. This can readily result in damage to the BEOL wiring and dielectric levels or layers during wirebonding located beneath the wirebond pad, resultingly creating a risk of impaired reliability in the performance of such electronic devices upon installation and subsequent utilization thereof.

For instance, low-k dies and wafer or pad materials are well known and widely employed in the present technology, having particular reference to the disclosure of Landers, et al., U.S. Patent Publication No. 2004/0129938 A1, the latter of which is commonly assigned to the present assignee, and the disclosure of which is incorporated herein in its entirety. In that instance, the low-k material of the wafer or pad may be subjected to damage by cracking, as detected by a serpentine crack sensor, and wherein the wirebond pad is supported, in essence, by a dense grid of BEOL wiring and vias, commonly referred to as CLVS in the technology. However, the use of such CLVS inhibits the efficient use of any chip area, which is to be located beneath the pad, thereby necessitating an increase in the chip size and, resultingly preventing an efficient use by active devices and/or diodes of the area beneath the wirebond pads in order to maximize utilization of available installation space.

In essence, any readily susceptible damage of a mechanical nature, which may be imparted to low-k dielectric materials conceivably results from production activities, such as for example, chip dicing, which frequently causes the damage in the form of cracks to be produced as a result of final wafer finishing steps or module build up, which requires moisture/oxidation barrier for the protection of a low-k dielectric semiconductor. This, of course, can readily result in chip failure in the field, and pursuant to the above-referenced U.S. Patent Publication No. 2004/0129938 A1, there is provided a dual pyramidal or multi-level moisture/oxidation barrier with the employment of an additional structure acting as a physical crack propagation stop.

As previously indicated, such BEOL dielectric materials, which are of a low-k nature, are softer and weaker than conventional oxide BEOL films; for instance, such as inorganic oxide dielectric materials, i.e., silicon dioxide, silica glass, or fluorinated silica glass, produced by chemical vapor deposition (CVD) or spin on glass (SOG) processes.

Consequently, the removal of these CLVS's (BEOL dielectric films) in the use of wiring under pads is being considered today in the technology, and during this qualification of installation, the rate of pad tearout or damage sustained is extremely sensitive to minute changes in the structures (SUP), which are located underneath the pads. In view of the foregoing, it is impossible to predict the reaction of BEOL dielectric materials underneath the pad, while permitting for a maximum use of the area underneath the pad to be employed for the positioning and arrangement of active devices and diodes. Although the sorting out of damaged components can be implemented at the time of implementing module tests, there can also be employed a sensor which is read out while a chip is in operation in the field facilitating the sorting out, so as to avoid undue damage being sustained by other components.

Furthermore, as also set forth in Davis, et al., U.S. Pat. No. 6,650,010 B2, which is commonly assigned to the assignee of the present application, the disclosure of which is incorporated herein in its entirety, this provides for a mesh-like reinforcing structure, which will inhibit the lamination cracking in a multi-layer semiconductor device using low-k dielectric materials and copper-based metallurgy. However, as in the above-referenced Landers, et al., U.S. Patent Publication No. 2004/0129938 A1, this does not provide for the utilization of a sensor facilitating that a chip, which has been impacted during assembly or manufacturing process, and which may be subjected to the formation of a crack or similar damage to be sorted out and removed determinate of a manufacturing yield or product output loss, rather than having the damaged chip exposed to installation out in the field and resultingly creating a reliability risk. As indicated, this removal of a damaged chip can be implemented at a module test, i.e., during the manufacturing process, or the sensor can be read out while the chip is in operation in the field.

2. Discussion of the Prior Art

In order to provide various methods and apparatus which will enable damage or die crack detection, numerous patents are currently in evidence, however, none of which provide for a wirebond crack sensor for low-k dies or wafers, which function in a manner analogous to that disclosed by the present invention.

Blish, et al., U.S. Pat. No. 6,548,881 B1, disclosed a method and apparatus, which enables the sensing of bond pad crater failures and provides circuitry, which determines the electrical and mechanical integrity of a polysilicon meander, located beneath each bond pad in an integrated circuit device.

Shu, U.S. Pat. No. 6,503,820 B1, discloses a die pad crack absorption fabrication system for integrated circuit chips, which is adapted to minimize the spread of cracks between layers of an integrated circuit chip. This is implemented by means of elastic filler blocks between intermetallic oxide layers of an integrated circuit chip and which will absorb stress energy, thereby reducing the spread of the crack through the layers of the integrated chip.

Blish, et al., U.S. Pat. No. 6,395,568 B1, provides for a method and apparatus for bond pad crater jeopardy identification in integrated circuits, and also facilitates for determination of a microcrack formation in several layers under a transistor due to the sensing of a reduction in a current passing through the resistor.

Dishongh, et al., U.S. Pat. No. 6,366,209 B2, discloses the provision of a circuit which senses changes in the electrical characteristics of a guard ring and responsively generates a signal to impart information with regard to a detected failure of one or more electronic components, and thereby enables the early detection of a degradation in the reliability of the electronic devices, which incorporate the circuit.

Leedy, U.S. Pat. No. 6,682,981 B2, provides for the a disclosure of a method employed in the fabrication of integrated circuits from flexible membranes in a stress controlled mode, whereby the membranes are formed of very thin low stressed dielectric materials, such as silicon dioxide or silicon nitrate and semiconductor layers.

Other types of semiconductor devices and manufacturing methods, which may incorporate devices comprising low-k dielectric materials and wherein various kinds of damage, such as crack formation may be determined, are set forth at varying degrees and aspects in Gass, et al., U.S. Pat. No. 6,756,908 B2; Hsiung, et al., U.S. Pat. No. 6,759,860 B1; Towle, et al., U.S. Patent Publication No. 2004/0099877 A1; Downey, et al, U.S. Patent Publication No. 2004/0119168 A1; and European Patent Specification EP 0 895 073 B1, the latter of which, in particular, is primarily determined for measuring cracks in a workpiece, such as an electronic semiconductor component.

SUMMARY OF THE INVENTION

In effect, none of the foregoing described patent publications, describe a wirebond crack sensor in the nature of a basic BEOL wiring structure, which comprises metal lines separated at a minimum and uniquely arranged spacing. These wires are adapted to be checked for continuity and leakage to detect damaged dielectric materials and, particularly, in determining the presence of damage-sustained cracks in a low-k die, wafer or pad.

Accordingly, the present invention relates to a novel BEOL crack detecting sensor, which enables the rejection of components during manufacture at the time of module tests, and which even facilitates detection and enables replacement of suspected defective components in the field, whereby the inventive crack sensor comprises a simple serpentine/comb test structure on a top wiring level in a multi-level wafer structure.

The BEOL crack sensor essentially comprises a wirebond structure, which is particularly, although not limited to sensing damage encountered by low-k dies, wafers or pads employed in the semiconductor technology. Hereby, the wirebond crack sensor is constituted of a basic BEOL wiring arrangement, which provides for metal lines separated from each other at minimum practical spacings. In order to be able to check for continuity in the wiring circuits of the semiconductor devices employing chips formed from the dies or wafers, and leakage for detecting damaged dielectric components. The damage, which may be detected by the wirebond crack sensor, is BEOL dielectric cracking and delamination of layers encountered in response to wirebonding and wire pull test implemented during the manufacturing processes employed for SUPs (structures under pads). Detection of damage, such as dielectric material cracks, can even be implemented in the field by means of the inventive wirebond crack sensor so as to be able to sort out and replace damaged components in the absence of damage being encountered by the remaining components of the electronic active device.

In order to attain the foregoing advantage, the invention contemplates the provision of a novel and unique wirebond crack sensor constituted of a simple and highly effective test structure incorporating a serpentine and comb-like wiring arrangement on preferably a top wiring level below a pad or wafer being tested for mechanical damage.

It is also possible to employ a stitched serpentine and comb wiring structure for the crack sensor in two levels of a multilevel semiconductor device connected by means of vias. This enables determination as to the occurrence of any delamination and circuit continuity failures due to any excessive shear forces, which have acted on the vias during module testing implemented in the process of manufacture. The foregoing and other features of the inventive wirebond crack sensor and method of utilization and physical application thereof are elucidated in further more specific detail hereinbelow.

Accordingly, it is an object of the present invention to provide a novel wirebond crack sensor for low-k dies, wafers and pads, which incorporates a serpentine and comb test structure for detecting damage to dielectric components of a semiconductor device.

Another object of the invention resides in the provision of a method of testing for crack damage encountered by low-k components utilizing the novel serpentine and comb wiring test arrangement of the wirebond crack sensor.

BRIEF DESCRIPTION OF THE DRAWINGS

Reference may now be made to the following detailed description of preferred embodiments of the invention, taken in conjunction with the accompanying drawings; wherein.

DETAILED DESCRIPTION OF THE INVENTION

Figure 1A:
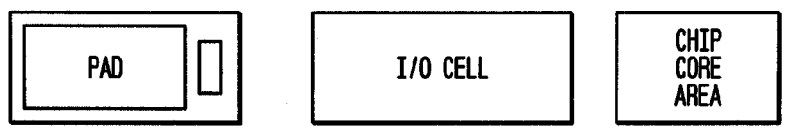
FIGS. 1A through 1C illustrate, respectively, various positioning of pads relative to SUPs (Structures Under Pads) with regard to a chip core area.
Figure 1B:
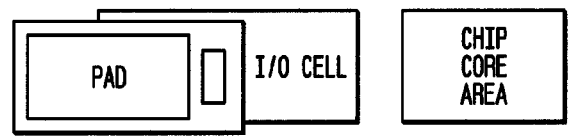
Figure 1C:
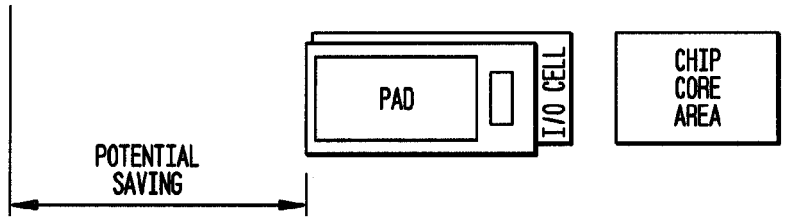

Referring in particular detail to the drawings, FIGS. 1A through 1C illustrate, respectively, various positions of a pad 10, relative to I/O cells 12 and chip core areas 14 of a semiconductor arrangement including active devices or diodes. Referring in particular to FIG. 1A of the drawings, this illustrates the extended dimension of a pad from a chip edge 16 and the inner end of an I/O cell 12, in which the structures are not located under the pad (SUP) causing all of the active devices and diodes to be exposed and distant from the pad.

With regard to FIG. 1B of the drawings, this illustrates the pad 10 being partially positioned over the I/O cell 12, but still not located over any active devices, but rather only over the diodes of the semiconductor arrangement.

Finally, with regard to the embodiment of FIG. 1C of the drawings, this illustrates the pad 10 of the semiconductor device fully arranged over active devices and diodes, whereby all of the latter are arranged under the pad 10 and, consequently, affording considerable savings in die size, as illustrated by the dimension line relative to the previous dimension from the chip edge to the inner end of the I/O cell of FIG. 1A.

Consequently, the positioning of all (Structures Under Pad) SUPs affords a significant savings in die size and a higher efficiency in preparing and manufacturing the semiconductor devices.

Figure 2A:
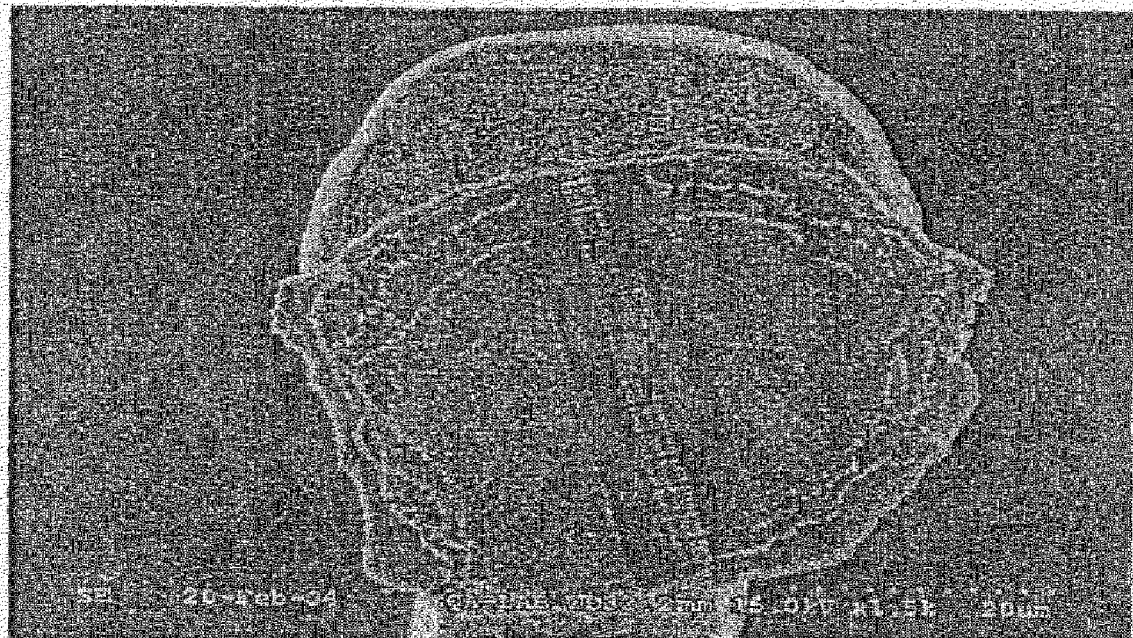
FIG. 2A diagrammatically illustrates a gold ball of a BGA shown with CLVS supports in the center and side.

With regard to providing the structure under pads (SUPs) for low-k dielectric materials, in which the dielectric materials are significantly weaker and have a poorer adhesion property then conventional oxide BEOL films, reference may be made to FIG. 2A of the drawings, showing a gold ball 20, which is essentially welded or positioned on a chip 22 as parted of a ball grid array (BGA). Shown are CLVS supports 24, 26 for the gold ball at the center and side of the structure mounting the gold ball 20. However, the weaker mechanical properties of the low-k dielectric materials of the support allows for BEOL dielectric cracking and delamination during wirebonding and wire pull tests which are effected during the manufacturing process.

Figure 2B:
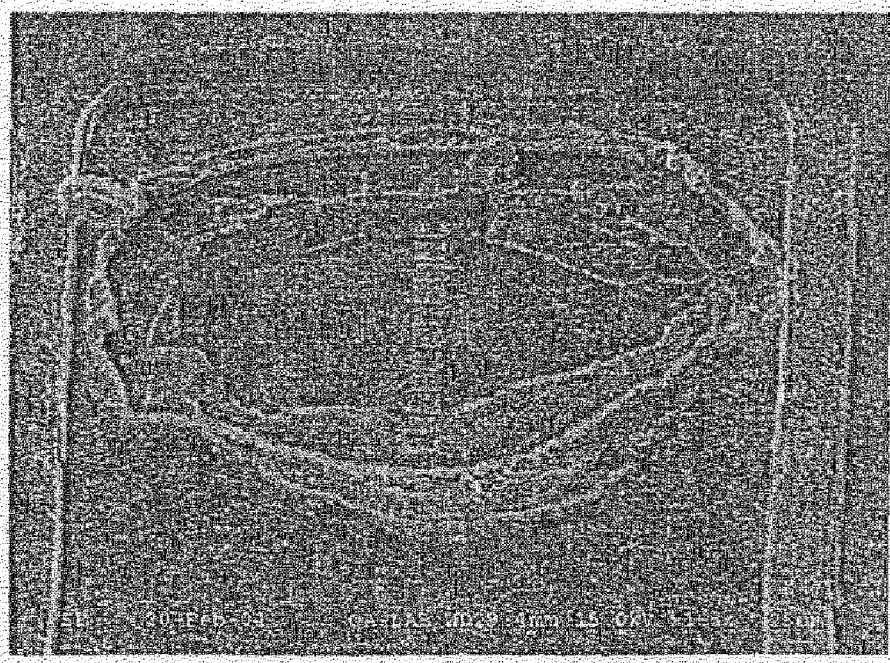
FIG. 2B illustrates crack damage encountered in the support structure of FIG. 2A as a result of wirebonding or welding of the gold ball.

This is clearly illustrated in FIG. 2B of the drawings showing the damage encountered during these particular process steps, thereby rendering the cracking of the low-k dielectric materials a cause for having to sort out and discard the component. Furthermore, in as much as these particular low-k dielectric materials are also sensitive to oxygen and moisture ingress, there is encountered a risk of reduced or impaired functional reliability in the event that these components are damaged during the manufacturing process and assembly.

Figure 3A:
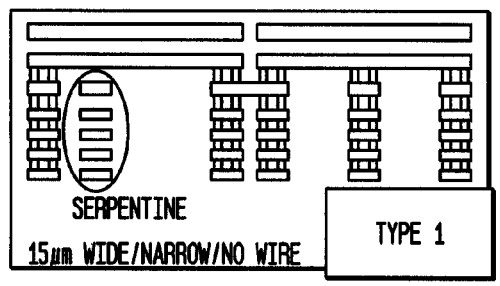
FIGS. 3A through 3F illustrate, respectively, low-k test sites designed to evaluate different structures under pads (SUPs)
Figure 3B:
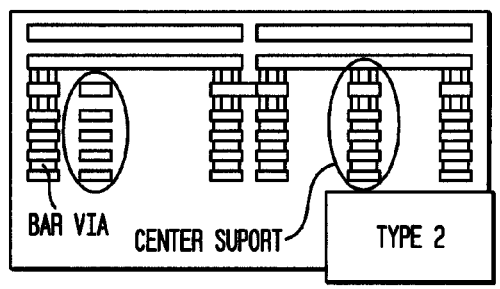

Reverting to FIGS. 3A through 3F of the drawings, these indicate various low-k test sites, which are adapted to evaluate the different structures under pads (SUPs). Thus, as illustrated in FIG. 3A, a serpentine wirebond structure 30 may be provided beneath a pad 32 so as to afford a testing of pad tearout on BEOL wiring designs. Similarly, FIG. 3B shows a bar via 34 and a serpentine crack sensor proximate a center support 36.

Figure 3C:
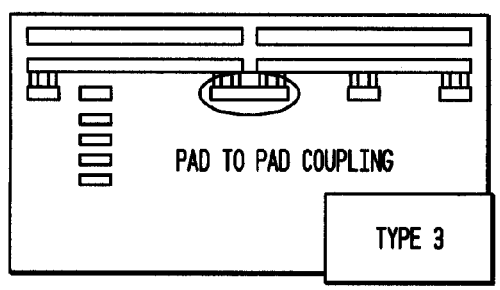
Figure 3D:
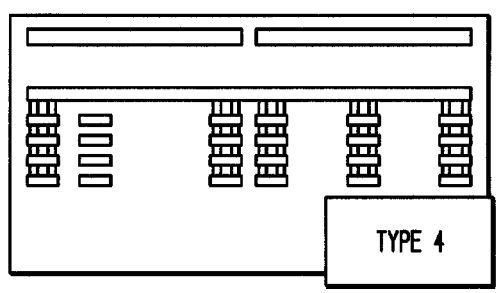

Reverting to FIG. 3C of the drawings, this shows pad-to-pad coupling of the semiconductor device, as described in further detail hereinbelow; whereas FIG. 3D shows a continuous plate or surface area, as shown and described in detail with regard to FIGS. 4 and 5 of the drawings hereinbelow.

Figure 3E:
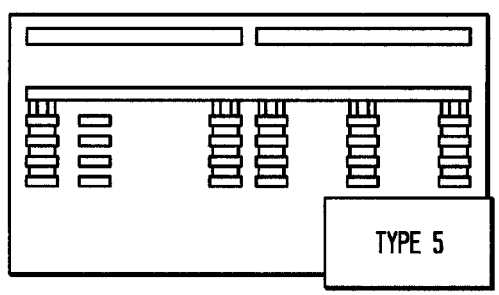
Figure 3F:
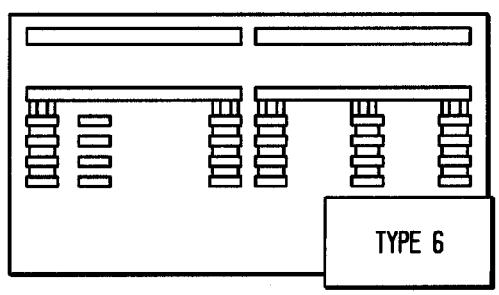

As shown in FIG. 3E of the drawings, there is also described a continuous structure for testing and checking for crack damage, as shown in FIG. 3D, whereas FIG. 3F illustrates a further pad tearout wiring design.

The foregoing structures, which provide for low-k dielectric materials, have demonstrated through experimentation that extensive pad tearouts are encountered for larger ball sizes which indicate that damage, such as cracking, is encountered during bonding steps for the ball, as provided for in FIG. 2B of the drawings.

Reverting now to FIG. 4, there is shown a typical dielectric layer 40 having a plurality of the inventive serpentine and comb wire bond crack sensors 42 embedded therein, particularly extending proximate the edges 44 of the dielectric plate structure 40, which is located below a pad, die or wafer.

Figure 4:
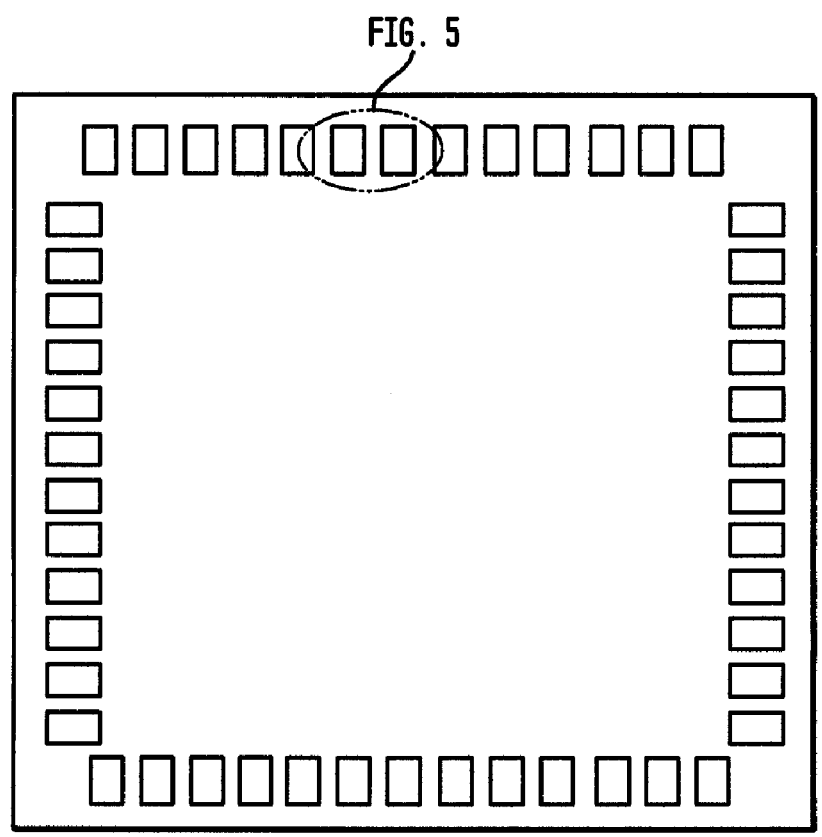
FIG. 4 illustrates an arrangement of BEOL serpentine and comb crack sensor stress testing structures arranged on a top wiring level of an electronic device located under a wafer or pad.
Figure 5:
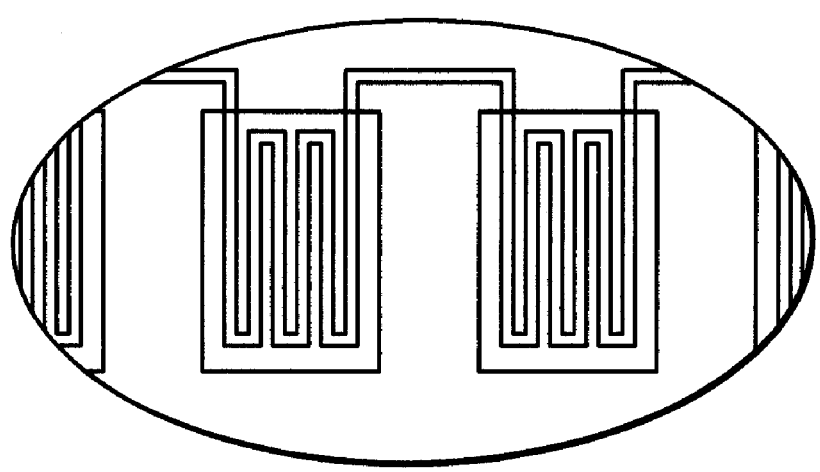
FIG. 5 illustrates, on an enlarged scale, a representation of a pair of the BEOL crack sensors, as shown in the encircled portion of FIG. 4.

As shown, on an enlarged scale in FIG. 5, which represents a detail as encircled in FIG. 4, this illustrates a pair of the sensors 42 having the wirebond serpentine and comb wiring 46 provided therein, which enables detection and replacing of possibly damaged components during a module test, in effect, at the site of assembly, or also permits detection and replacement of suspected damaged components in the field. This is implemented by means of the simple serpentine and comb test or sensing structure arranged on the top wiring level of any semiconductor device below the pad.

Figure 6:
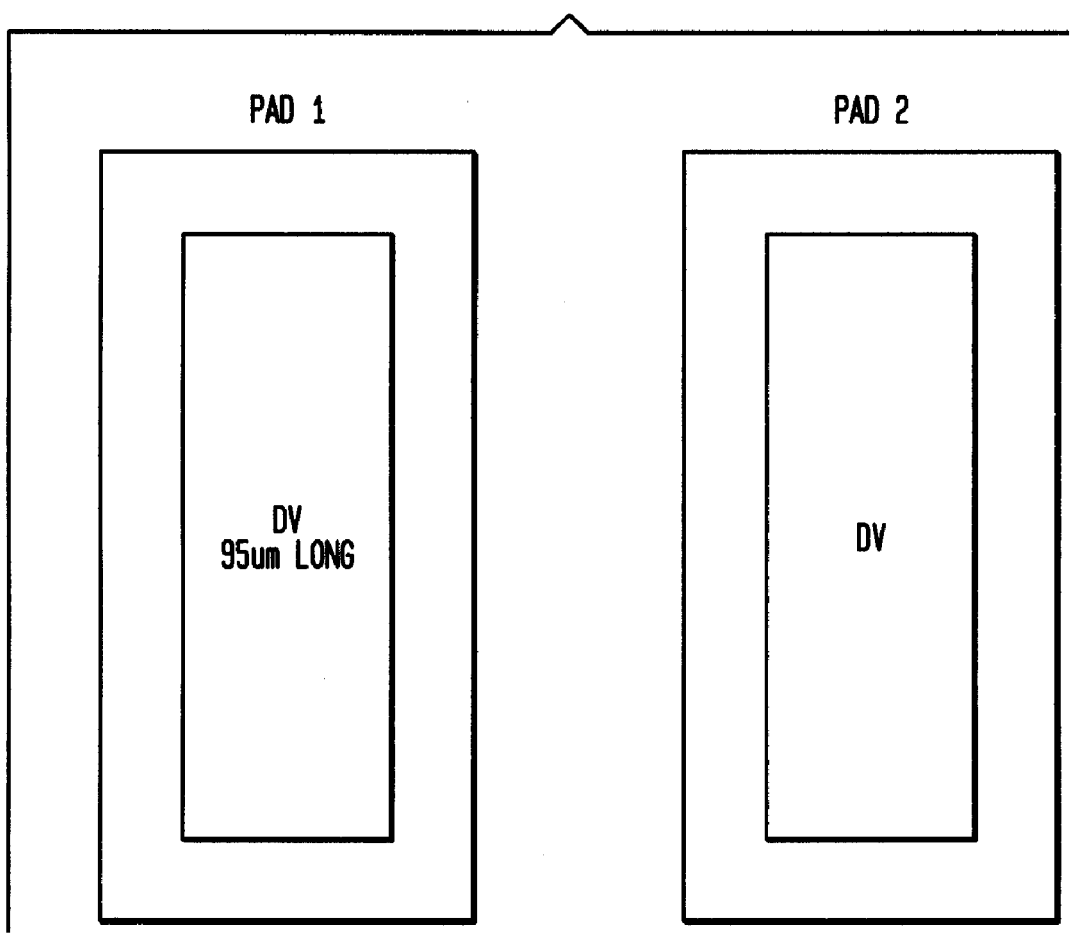
FIG. 6 illustrates a pair of spaced pads, which are adapted to be equipped with wirebond crack sensors.
Figure 7:
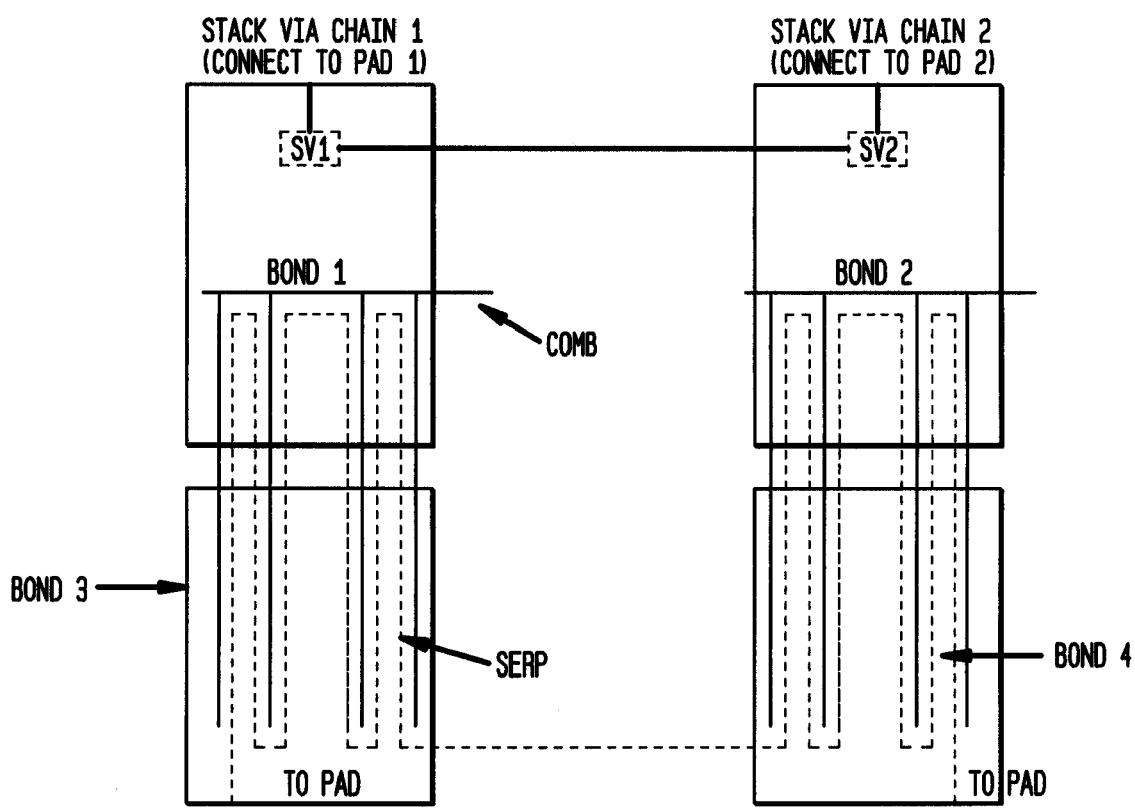
FIG. 7 illustrates, diagrammatically, stacked via chains employing stitched serpentine and comb sensor structures to determine delamination damage.

As shown in FIG. 6 of the drawings, this illustrates pads 1 and 2 in a side-by-side relationship adapted to be tested for integrity by means of the serpentine and comb wire crack sensor 42 of the invention, as detailed particularly in FIG. 7 of the drawings.

In that instance, a multilevel stack uses a stitch comb and serpentine structure, whereby on a bond 1 of a first stack via chain 50, there is connection made to a bond 3, by means of the serpentine wiring 52 and then a comb wiring 54 in the bond 1, whereby the serpentine wiring leads to a pad.

Furthermore, in a second stack structure representing a via chain 60 in low-k levels, which is used to check delamination, has a connection made from a bond 2 to bond 1, by means of further via chain 62, which is more sensitive to delamination and continuity failures caused by excessive shear forces imparted to the vias. Hereby, the combs and the serpentine of the crack sensor are connected in top two levels by means of vias.

As described, two particular aspects have bond 1 connected to bond 2 to provide a continuity test for the via chains in low-k dielectric materials.

Bond 3 is connected to bond 4 to provide a continuity test for the serpentine in the upper level.

Bond 1 is connected to bond 3 to provide a leakage test for comb to serpentine and serpentine to the via chain, whereas bond 2 is connected to bond 4 to provide a leakage test for comb to serpentine and serpentine to via chain.

The foregoing operative connections enable a device to onsite monitor any integrated circuit for areas using the low-k dielectrics and detect damage, such as cracking, caused by bonding or packaging.

From the foregoing, it becomes readily apparent that the present invention is directed to a unique and simple structure comprising serpentine and comb test wirebond crack sensors located at levels below a die, wafer or pad. This enables the ready monitoring of SUP devices employed in the current technology.

While the present invention has been particularly shown and described with respect to preferred embodiments thereof, it will be understood by those skilled in the art that the foregoing and other changes in forms and details may be made without departing from the scope and spirit of the present invention. It is therefore intended that the present invention not be limited to the exact forms and details described and illustrated, but fall within the scope of the appended claims.

What is claimed is:

1. A sensor structure for measuring damage encountered by a semiconductor device, wherein said sensor structure comprises:

at least one wirebond sensor, said at least one wirebond sensor comprising a BEOL wiring arrangement, including circuitry for determining damage in a low-k die, wafer or pad, said circuitry wirebonding serpentine and comb-like wiring in a dielectric substrate, said BEOL wiring arrangement comprising an array of serpentine and comb-like wiring located at minimum spacings so as to check for continuity in the wiring circuits of semiconductor devices employing chips formed from said die, wafer or pad, and for detecting leakage current indicative of damaged dielectric components.

2. A sensor structure as claimed in claim 1, wherein said sensor structure is located under a pad or wafer of said semiconductor device so as to detect cracks encountered by said pad or wafer responsive to wirebonding and wire pull tests.

3. A sensor structure as claimed in claim 2, wherein said sensor structure is located a top wiring level arranged under a wirebond or wafer.

4. A sensor structure as claimed in claim 1, wherein said at least one wirebond sensor detects damage in the nature of BEOL (back-end-of-line) wiring and dielectric cracking and delamination of layers in a multilevel semiconductor device.

5. A sensor structure as claimed in claim 2, wherein said structure comprises a stitch serpentine and comb wiring array for at least two levels of a semiconductor device connected by vias.

6. A sensor structure as claimed in claim 5, wherein said structure represents a via chain in low-k levels for checking the integrity of laminations in the layers of said semiconductor device.

7. A sensor structure as claimed in claim 6, wherein a plurality of via chains interconnect said serpentine and comb wires of a plurality of sensors in at least two levels to provide a continuity test for the via chains in low-k dielectric materials.

8. A method of providing a sensor structure for measuring damage encountered by a semiconductor device, wherein said method comprises:
providing at least one wirebond sensor, said at least one wirebond sensor comprising a BEOL wiring arrangement, including circuitry for determining damage in a low-k die, wafer or pad, said circuitry wirebonding serpentine and comb-like wiring in a dielectric substrate, and said BEOL wiring arrangement comprising an array of serpentine and comb-like wiring located at minimum spacings so as to check for continuity in the wiring circuits of semiconductor devices employing chips formed from said die, wafer or pad, and for detecting leakage current indicative of damaged dielectric components.

9. A method as claimed in claim 8, wherein said sensor structure is located under a pad or wafer of said semiconductor device so as to detect cracks encountered by said pad or wafer responsive to wirebonding and wire pull tests.

10. A method as claimed in claim 9, wherein said sensor structure is located at a top wiring level arranged under a wirebond or wafer.

11. A method as claimed in claim 8, wherein said at least one wirebond sensor detects damage in the nature of BEOL (back-end-of-line) wiring and dielectric cracking and delamination of layers in a multilevel semiconductor device.

12. A method as claimed in claim 9, wherein said structure comprises a stitch serpentine and comb wiring array for at least two levels of a semiconductor device connected by vias.

13. A method as claimed in claim 12, wherein said structure represents a via chain in low-k levels for checking the integrity of laminations in the layers of said semiconductor device.

14. A method as claimed in claim 13, wherein a plurality of via chains interconnect said serpentine and comb wires of a plurality of sensors in at least two levels to provide a continuity test for the via chains in low-k dielectric materials.

* * * * *